(12) United States Patent
Hsieh

(10) Patent No.: US 7,432,167 B2
(45) Date of Patent: Oct. 7, 2008

(54) METHOD OF FABRICATING A STRAINED SILICON CHANNEL METAL OXIDE SEMICONDUCTOR TRANSISTOR

(75) Inventor: Chao-Ching Hsieh, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 11/621,576

(22) Filed: Jan. 10, 2007

(65) Prior Publication Data

US 2008/0166841 A1 Jul. 10, 2008

(51) Int. Cl.
*H01L 21/336* (2006.01)
*H01L 21/8238* (2006.01)
*H01L 21/8234* (2006.01)

(52) U.S. Cl. ............... 438/300; 438/197; 438/222; 438/225; 438/226; 257/E21.633; 257/E21.634

(58) Field of Classification Search ............ 438/197, 438/222, 226, 225, 300; 257/E21.633, E21.634
See application file for complete search history.

(56) References Cited

U.S. PATENT DOCUMENTS

| 7,342,284 | B2* | 3/2008 | Ting et al. | 257/369 |
| 2007/0072353 | A1* | 3/2007 | Wu et al. | 438/197 |
| 2007/0128783 | A1* | 6/2007 | Ting et al. | 438/199 |
| 2007/0187727 | A1* | 8/2007 | Ting et al. | 257/274 |

* cited by examiner

*Primary Examiner*—Michael S. Lebentritt
*Assistant Examiner*—Mohsen Ahmadi
(74) *Attorney, Agent, or Firm*—Winston Hsu

(57) ABSTRACT

The present invention provides a method of fabricating strained silicon channel MOS transistor, comprising providing a substrate, forming at least a gate structure on the substrate, forming a mask layer on the gate structure, performing an etching process to form two recesses corresponding to the gate structure within the substrate, performing a selective epitaxial growth (SEG) process to form an epitaxial layer in the recesses respectively, and performing an ion implantation process for the epitaxial layers to form a source/drain region.

34 Claims, 22 Drawing Sheets

METHOD OF FABRICATING A STRAINED SILICON CHANNEL METAL OXIDE SEMICONDUCTOR TRANSISTOR

BACKGROUND OF THE INVENTION

1. Field of the Invention

The present invention relates to a method of fabricating a strained silicon channel metal oxide semiconductor (MOS) transistor, and more particularly, to a method of fabricating a strained silicon channel MOS transistor by using a mask layer to avoid the defects resulting from etching the recesses and the selective epitaxial growth (SEG) process in the prior art.

2. Description of the Prior Art

The selective epitaxial growth (SEG) process is widely applied in manufacturing numerous kinds of semiconductor devices, such as complementary metal oxide semiconductor (CMOS) transistors having raised source/drain regions and strained silicon channel CMOS transistors. The SEG process is used to form an epitaxial layer on a single-crystalline substrate, in which the crystalline orientation of the epitaxial layer is almost identical to that of the substrate.

Please refer to FIG. 1 to FIG. 3. FIG. 1 to FIG. 3 shows the strained silicon channel CMOS transistors fabricating process by using the SEG process. As shown in FIG. 1, a semiconductor substrate 100 such as a silicon substrate is provided first and the semiconductor substrate 100 has a first active area 102, a second active area 104, and a shallow isolation trench (STI) 106 positioned between the first active area 102 and the second active area 104, and then a first gate structure 112 and a second gate structure 114 are formed on the semiconductor substrate 100. A cap layer 116 is formed on the first gate structure 112, the second gate structure 114, and the semiconductor substrate 100, and a photoresist layer 117 is formed on the cap layer 116 above the second active area 104 and a portion of the STI 106, wherein the thickness of the cap layer 116 is about 500 to 600 angstroms. The first gate structure 112 includes a first gate oxide layer 118, a first gate 120 positioned on the first gate oxide layer 118, a silicon nitride layer 122 positioned on the first gate 120, and a first spacer 124, and the second gate structure 114 includes a second gate oxide layer 128, a second gate 130 positioned on the second gate oxide layer 128, a silicon nitride layer 132 positioned on the second gate 130, and a second spacer 134. In general, the first gate oxide layer 118 and the second gate oxide layer 128 are composed of silicon dioxide (SiO2), and the first gate 120 and the second gate 130 are composed of doped polysilicon. The silicon nitride layer 122 and 132 are used to protect the first gate 120 and the second gate 130 respectively.

As shown in FIG. 2, the first gate structure 112 and the photoresist layer 117 are used as an etching mask to perform an etching process in order to form two recesses 140 within the first active area 102 uncovered by the first gate structure 112, and then the photoresist layer 117 is removed.

Next, as shown in FIG. 3, after a pre-cleaning step is carried out for the first active area 102 of the semiconductor substrate 100, a SEG process is carried out to form an epitaxial layer 142 composed of SiGe in the recesses 140 respectively as SiGe source/drain. A photoresist layer is formed on the second active area 104.

Please note that when performing the etching process and the pre-cleaning step for the recesses 140, the etching gas and cleaning liquid such as diluted HF (DHF), will etch the corners of silicon nitride layer 122 and a portion of the first gate 120 is exposed, as shown in FIG. 2. The SEG process, which is carried out later, will form SiGe bumps 144 on the exposed portion of the first gate 120. Please refer to FIG. 3 and FIG. 4, wherein FIG. 3 is a schematic, cross-sectional diagram, and FIG. 4 is a photograph in reality. This defect will result in spacer leakage current or short problems, and the follow-up processes will be much more difficult. For example, when fabricating the contact plugs of the source/drain regions, the SiGe bumps might contact the contact plugs and become short, i.e. the contact plug process is affected by the SiGe bumps, and the yield is also affected badly.

SUMMARY OF THE INVENTION

The present invention relates to a method of fabricating a strained silicon channel metal oxide semiconductor (MOS) transistor, and more particularly, to a method of fabricating a strained silicon channel MOS transistor by using a mask layer to avoid the defects resulting from etching the recesses and the selective epitaxial growth (SEG) process in the prior art.

According to the claims, the present invention provides a method of fabricating a strained silicon channel MOS transistor, the method comprising providing a substrate; forming at least a gate structure on the substrate; forming a mask layer on the gate structure; performing an etching process to form two recesses corresponding to the gate structure within the substrate; performing a SEG process to form an epitaxial layer in the recesses respectively.

According to the claims, the present invention further provides a method of fabricating strained silicon channel complementary metal oxide semiconductor (CMOS) transistor device, the method comprising providing a substrate having thereon a first active area for fabricating a first transistor and a second active area for fabricating a second transistor, and an isolation structure between the first active area and the second active area; forming a first gate structure on the first active area, and a second gate structure on the second active area; forming a mask layer on the first gate structure and the second active area; performing an etching process to form two recesses corresponding to the gate structure within the substrate; performing a SEG process to form a first epitaxial layer in the recesses respectively; and forming a source/drain region of the second transistor to form the second transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
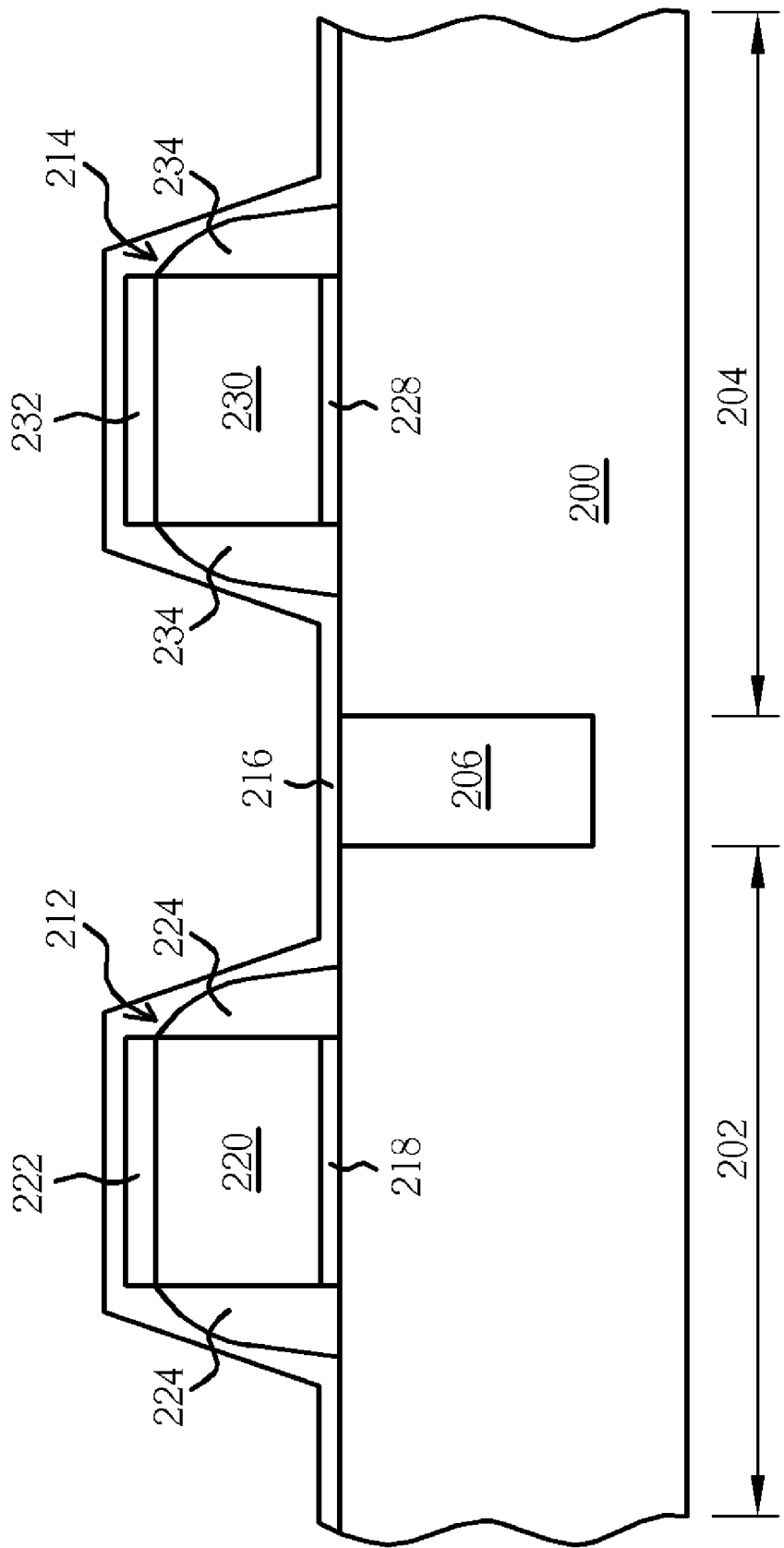
FIG. 5 to FIG. 12 shows schematic, cross-sectional diagrams illustrating a fabricating method of a strained silicon channel CMOS transistor in accordance with the first preferred embodiment of the present invention FIG. 13 to FIG. 17 shows schematic, cross-sectional diagrams illustrating a fabricating method of a strained silicon channel CMOS transistor in accordance with the second preferred embodiment of the present invention.

Please refer to FIG. 5 to FIG. 12. FIG. 5 to FIG. 12 shows schematic, cross-sectional diagrams illustrating a fabricating method of a strained silicon channel complementary metal oxide semiconductor (CMOS) transistor in accordance with the first preferred embodiment of the present invention. As shown in FIG. 5, the present invention first provides a substrate 200, and the substrate 200 has a first active area 202, a second active area 204, and an isolation structure 206 such as a shallow trench isolation (STI), or a local oxidation of silicon isolation layers (LOCOS), etc., positioned between the first active area 202 and the second active area 204, wherein the substrate 200 is a semiconductor substrate, but is not limited to a silicon wafer or a SOI. Next, a first gate structure 212 and a second gate structure 214 are formed on the semiconductor substrate 200, and then a cap layer 216 is formed on the first gate structure 212, the second gate structure 214, and the semiconductor substrate 200, wherein the cap layer 216 can be silicon dioxide (SiO2), and the thickness of the cap layer 216 can be about 50 to 200 angstroms. The first gate structure 212 includes a first gate dielectric layer 218, a first gate conducting layer 220 positioned on the first gate dielectric layer 218, a first passivation layer 222 positioned on the first gate conducting layer 220, and a first spacer 224, and the second gate structure 214 includes a second gate dielectric layer 228, a second gate conducting layer 230 positioned on the second gate dielectric layer 228, a second passivation layer 232 positioned on the second gate conducting layer 230, and a second spacer 234. In general, the first gate dielectric layer 218 and the second gate dielectric layer 228 are composed of SiO2, and the first gate conducting layer 220 and the second gate conducting layer 230 are composed of doped polysilicon. The first passivation layer 222 and second passivation layer 232 are used to protect the first gate conducting layer 220 and the second gate conducting layer 230 respectively.

Figure 6:
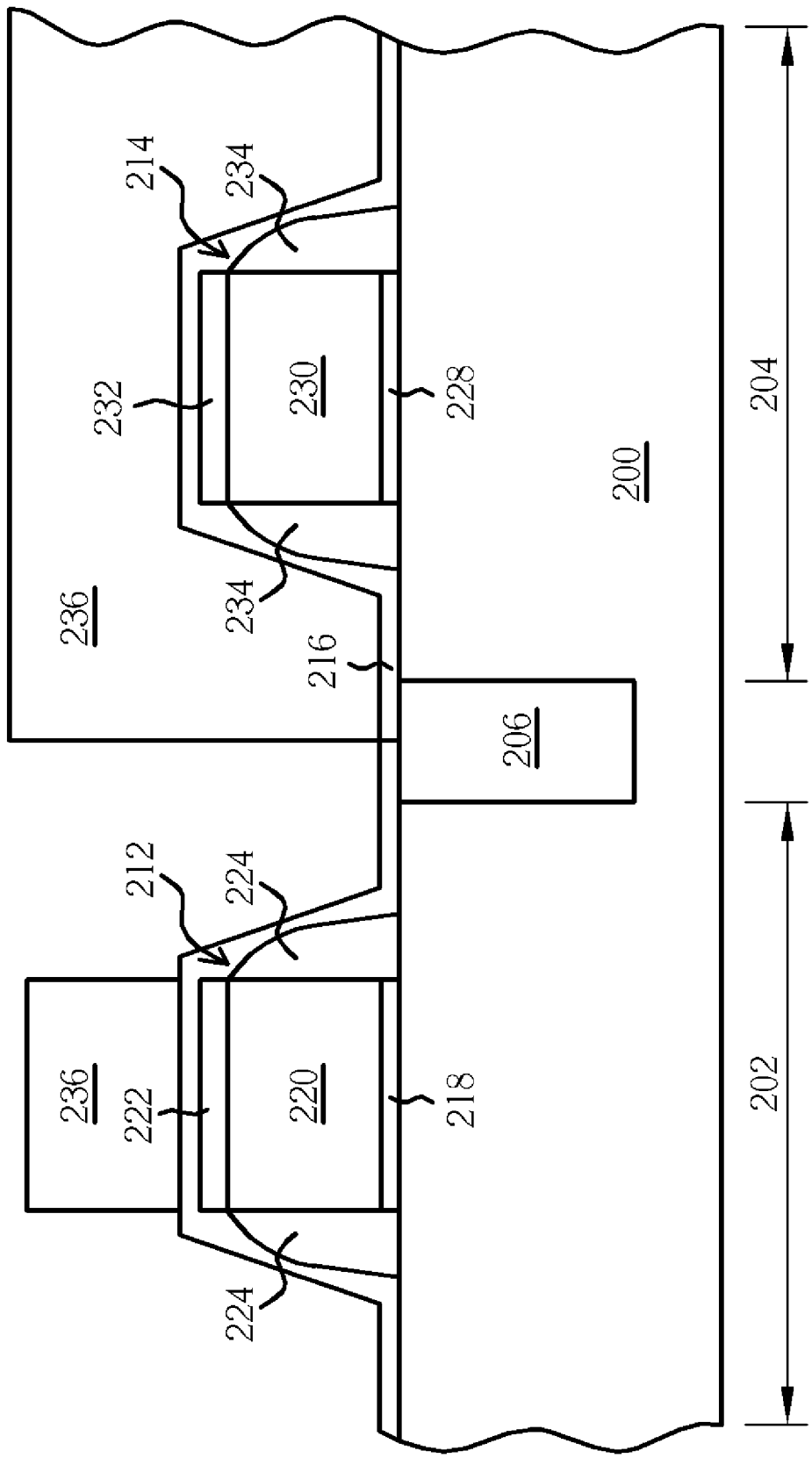

Next, as shown in FIG. 6, a patterned first mask layer 236 is formed on the cap layer 216 above the first gate structure 212, the second active area 204, and a portion of the isolation structure 206, wherein the first mask layer 236 can be materials with etching selectivity to the substrate 200, such as a photoresist layer. In addition, since the exposure misalign might happen when the first mask layer 236 is formed, and the first gate conducting layer 220 might have the critical dimension variation, in order to be sure that the first mask layer 236 on the first gate structure 212 can fully protect the first gate structure 212, the width of the first mask layer 236 on the first gate structure 212 has to be not smaller than the sum of the critical dimension of the first gate conducting layer 220, the critical dimension variation of the first gate conducting layer 220, and the exposure misalign of the first mask layer 236, and the width of the first mask layer 236 has to be not larger than the sum of the critical dimension of the first gate conducting layer 220 and the width of the first spacer 224 to avoid affecting the position of the recesses that will be formed later.

For example, when the critical dimension of the first gate conducting layer 220 is 40 nanometers, the critical dimension variation of the first gate conducting layer 220 is 25 nanometers, and the exposure misalign of the first mask layer 236 is 15 nanometers, and the width of the first spacer 224 is 60 nanometers, the width of the first mask layer 236 has to be larger or equal to 80 nanometers (40+25+15=80), and smaller or equal to 160 nanometers (40+60+60=160).

Figure 7:
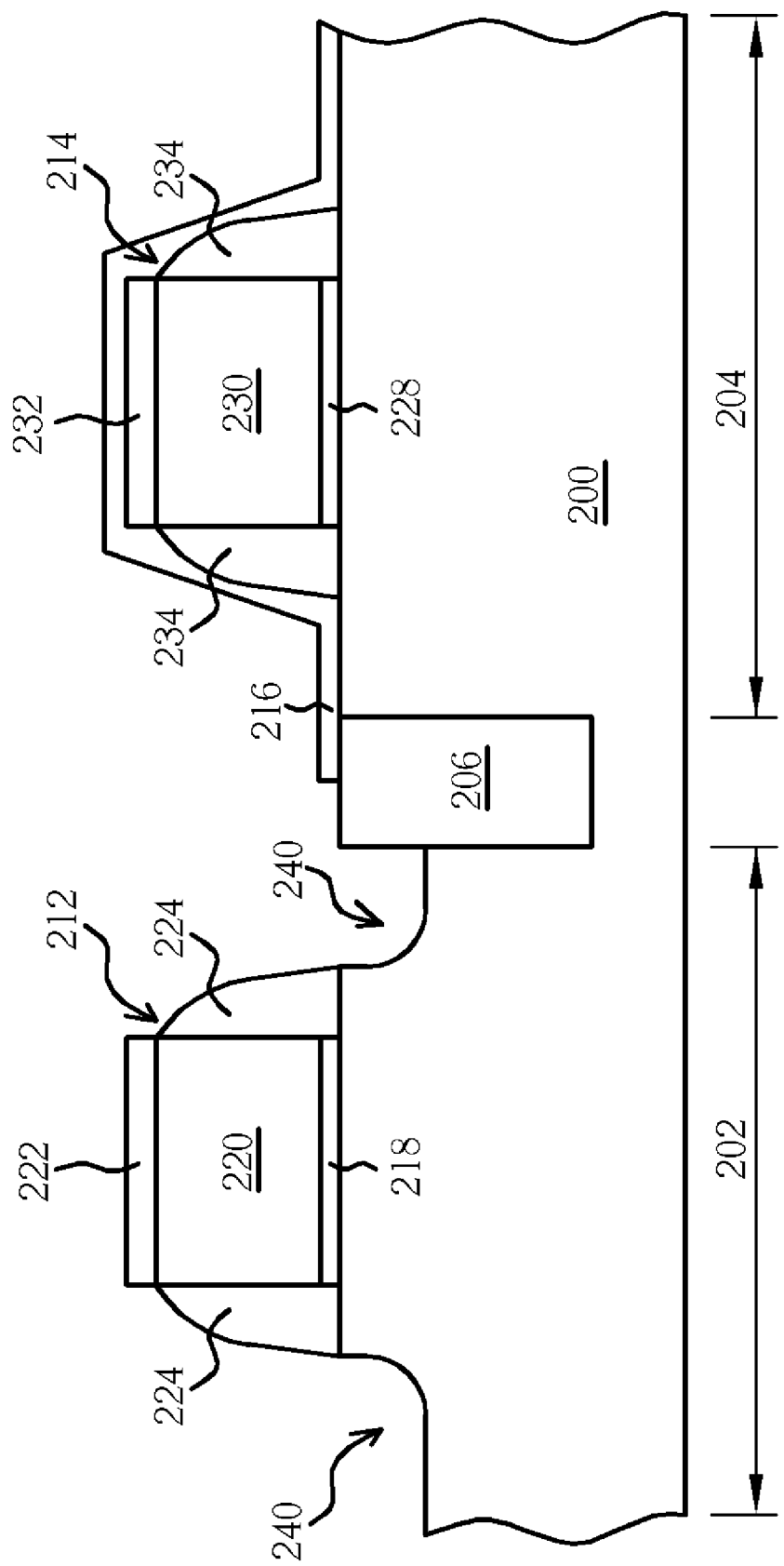

Next, as shown in FIG. 7, the first gate structure 212 and the first mask layer 236 are used as an etching mask to perform an etching process such as an anisotropic dry etching process, in order to form two recesses 240 within the first active area 202 uncovered by the first gate structure 212 and the first mask layer 236, and then and the first mask layer 236 is removed.

Figure 8:
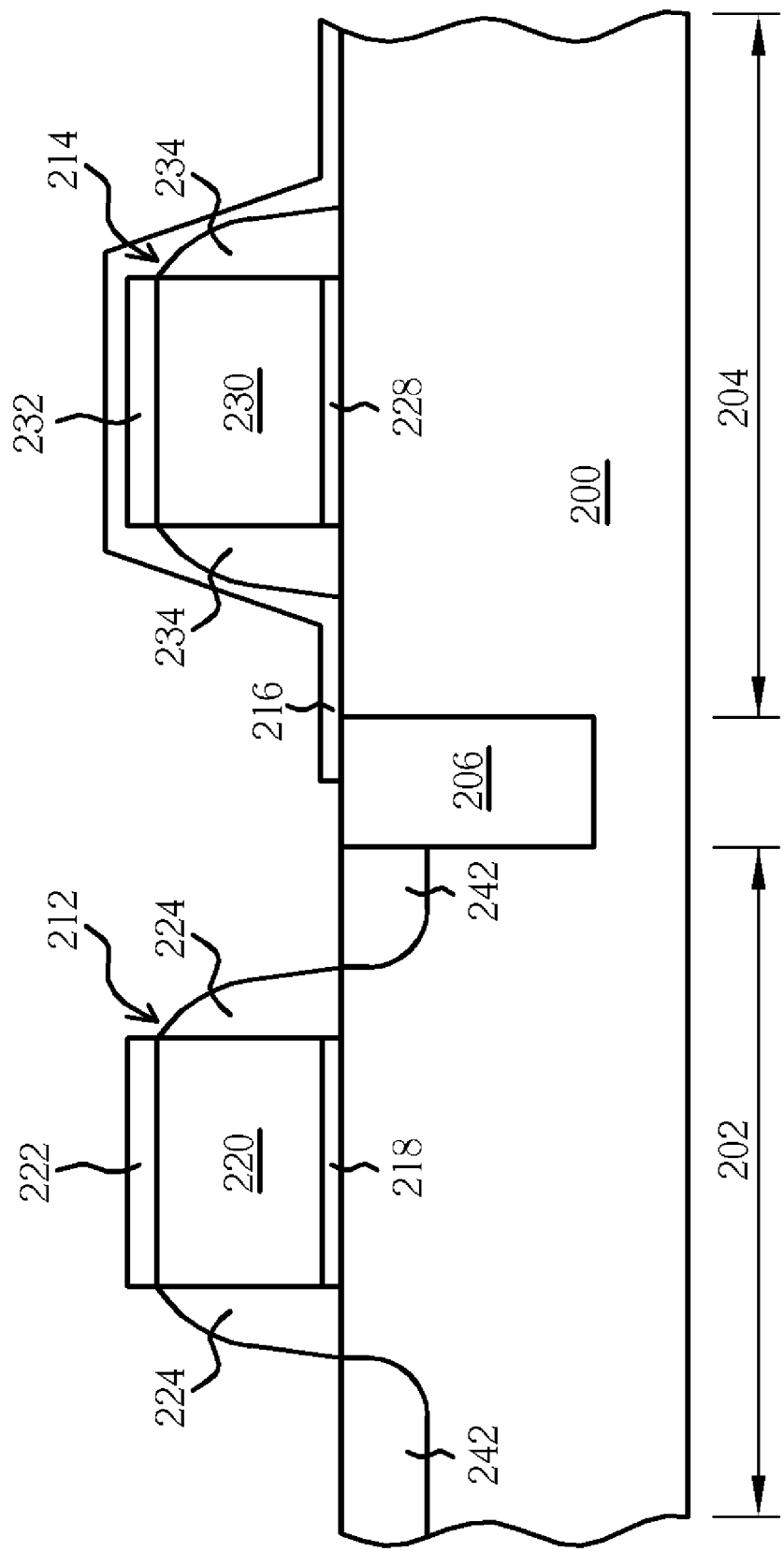

Then, as shown in FIG. 8, after a pre-cleaning step such as using DHF liquid or sulfuric acid-hydrogen peroxide mixture (SPM) liquid to remove impurities upon the surface of the recesses 240 is carried out for the first active area 202 of the semiconductor substrate 200, a selective epitaxial growth (SEG) process is carried out to form a first epitaxial layer 242 composed of SiGe in the recesses 240 respectively to form a compressive-stressed strained silicon channel in the semiconductor substrate 200 of the first gate structure 212.

Figure 9:
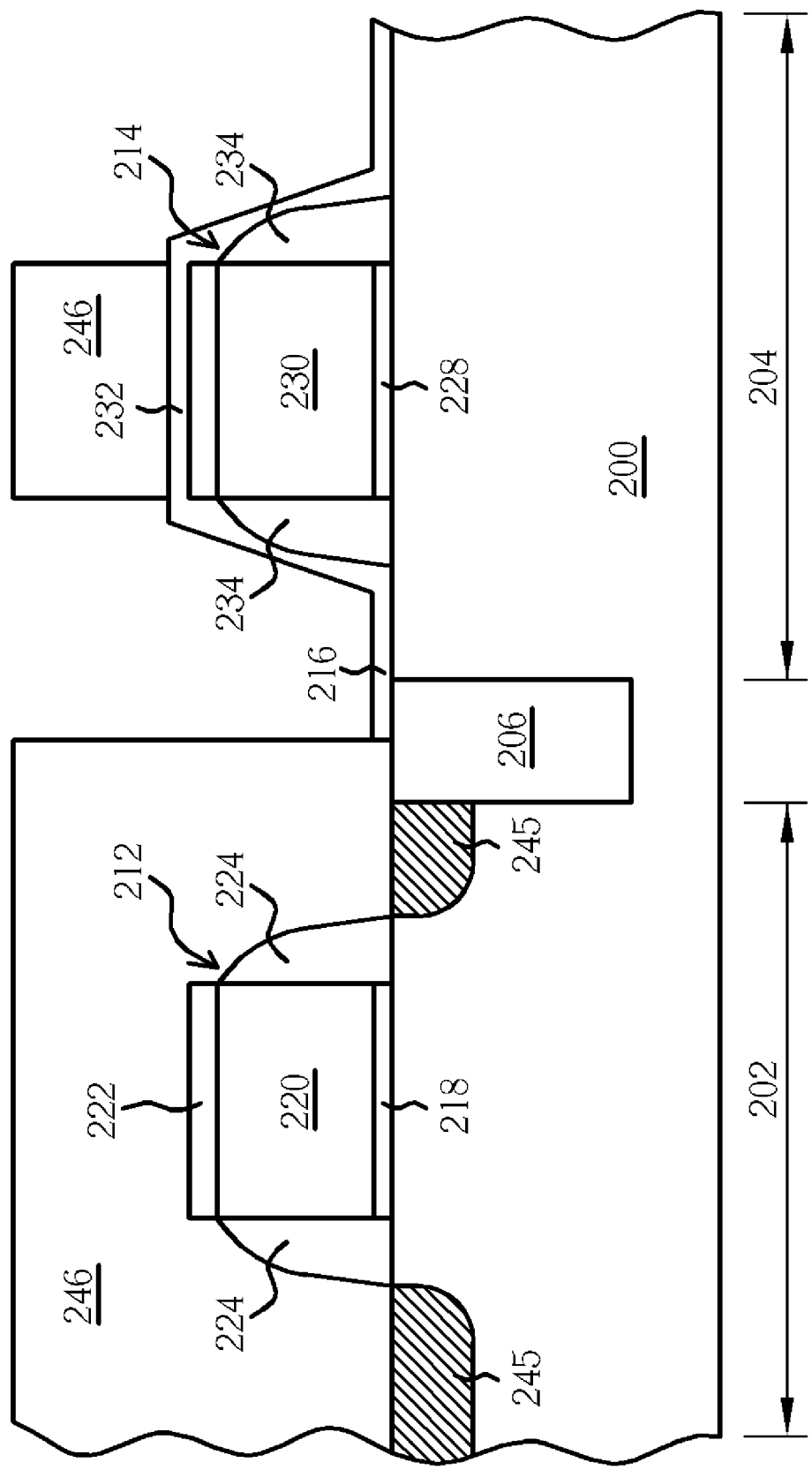

As shown in FIG. 9, and then the photoresist layer on the second active area 204 is removed. Next, a patterned second mask layer 246 is formed on the first active area 202 and the second gate structure 214, wherein the second mask layer 246 can be materials with etching selectivity to the substrate 200, such as a photoresist layer or a silicon oxide layer. In addition, since the exposure misalign might happen when the second mask layer 246 is formed, and the second gate conducting layer 230 might have the critical dimension variation, in order to be sure that the second mask layer 246 on the second gate structure 214 can fully protect the second gate structure 214, the width of the second mask layer 246 on the second gate structure 214 has to be not smaller than the sum of the critical dimension of the second gate conducting layer 230, the critical dimension variation of the second gate conducting layer 230, and the exposure misalign of the second mask layer 246, and the width of the second mask layer 246 has to be not larger than the sum of the critical dimension of the second gate conducting layer 230 and the width of the second spacer 234 to avoid affecting the position of the recesses that will be formed later.

Figure 10:
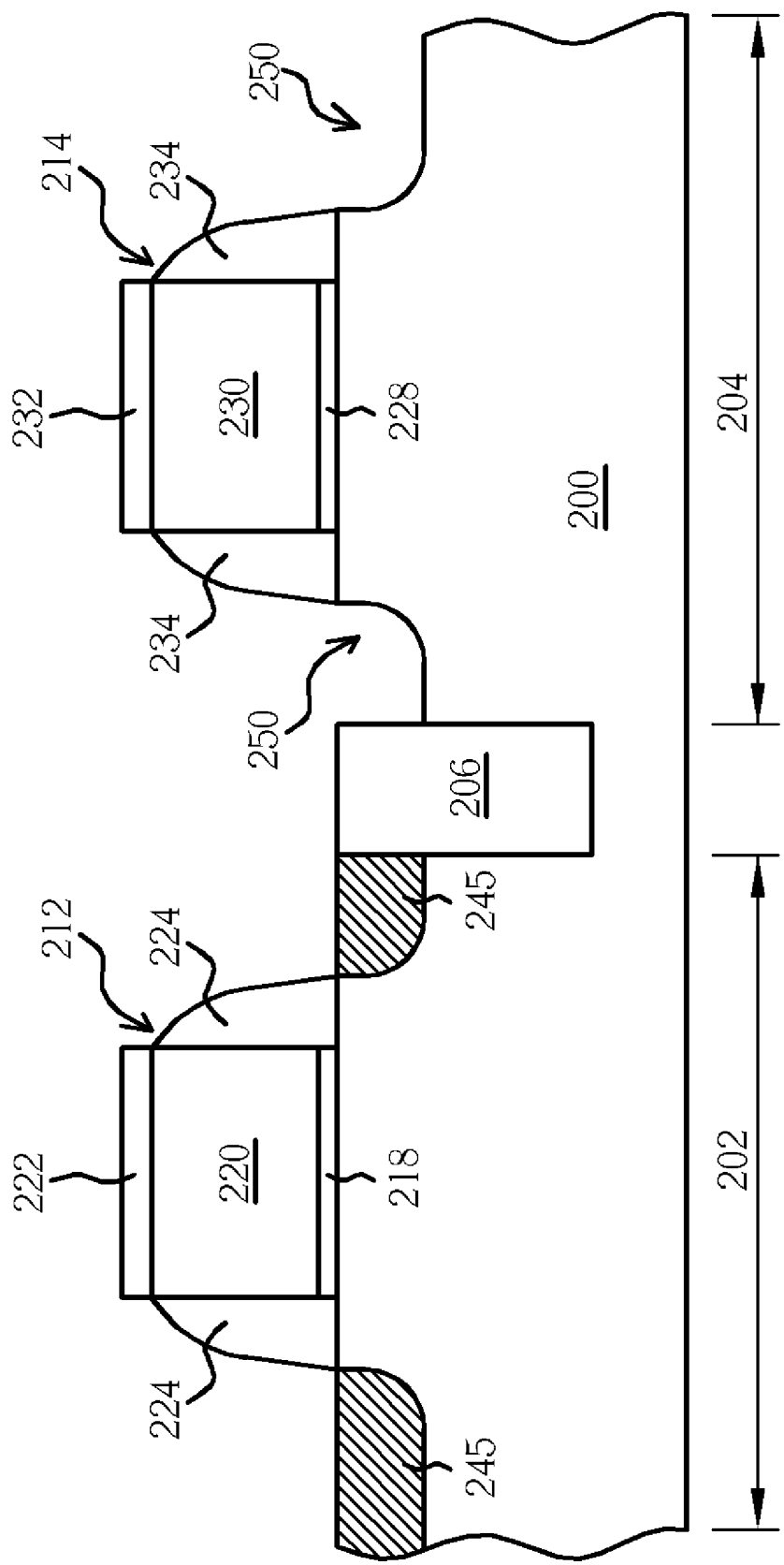
Figure 11:
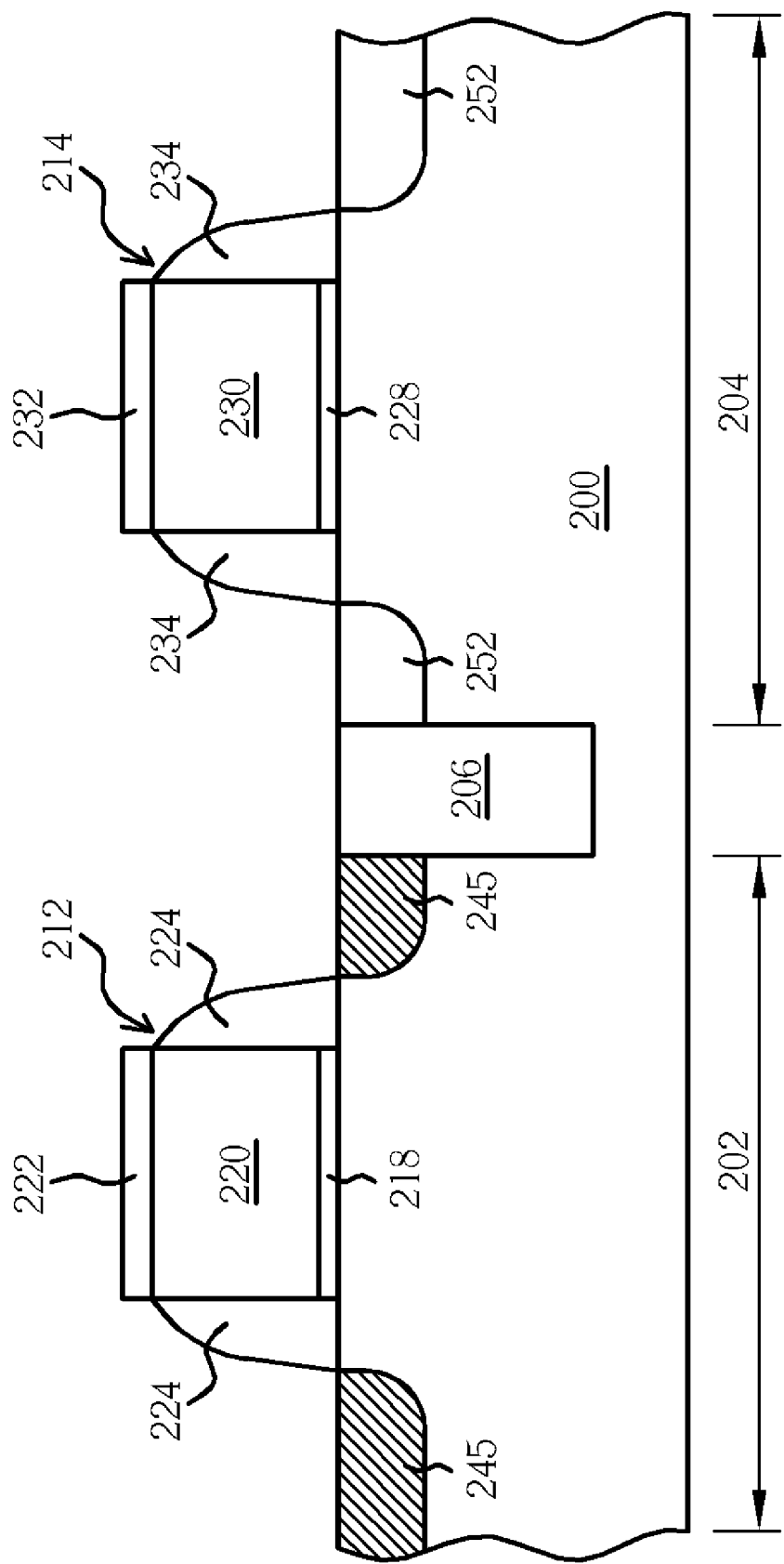

Next, as shown in FIG. 10, the second gate structure 214 and the second mask layer 246 are used as an etching mask to perform an etching process such as an anisotropic dry etching process, in order to form two recesses 250 within the second active area 204 uncovered by the second gate structure 214 and the second mask layer 246, and then and the second mask layer 246 is removed.

Figure 1:
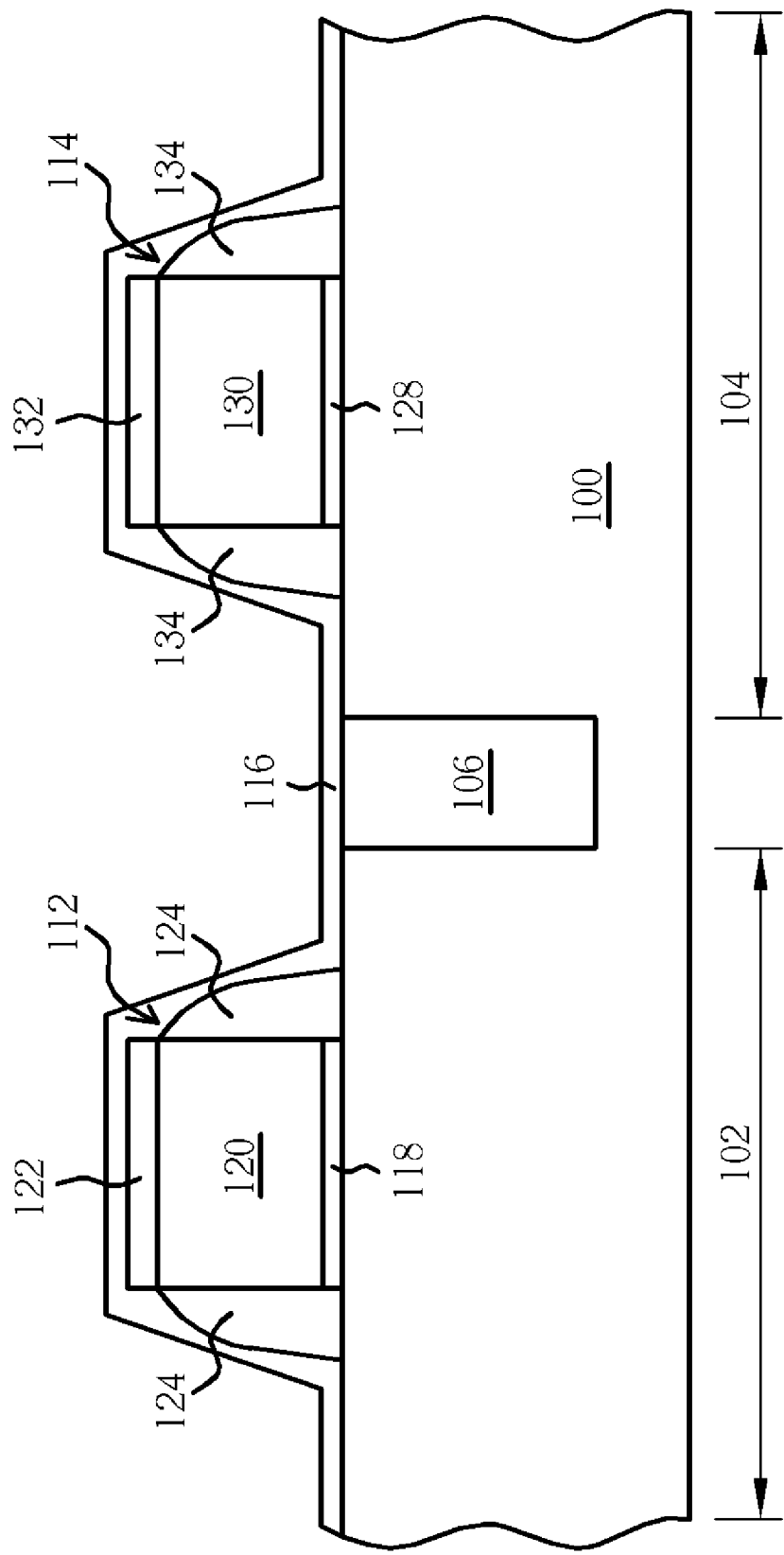
FIG. 1 to FIG. 4 shows the strained silicon channel complementary metal oxide semiconductor (CMOS) transistors fabricating process by using a selective epitaxial growth process.
Figure 2:
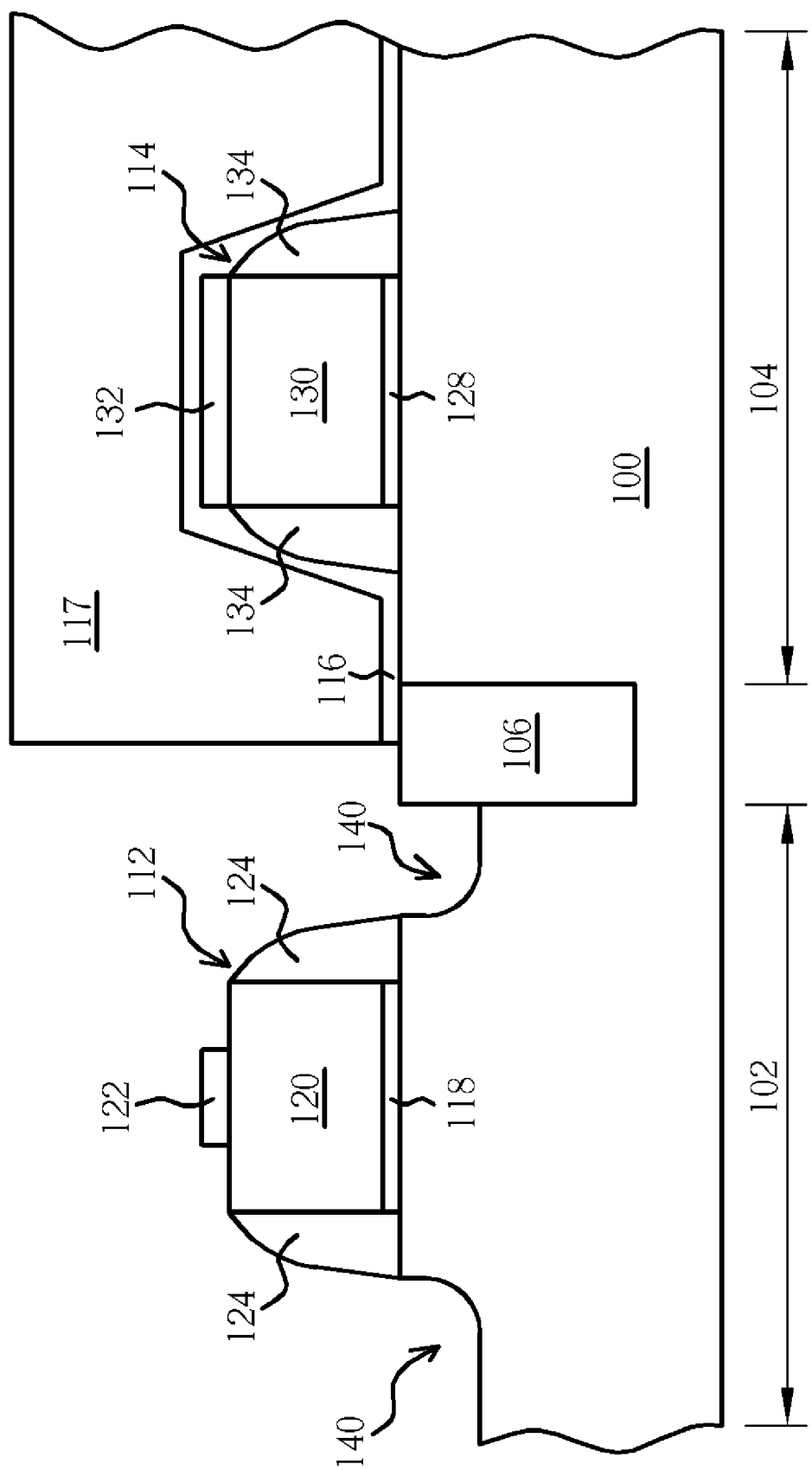
Figure 3:
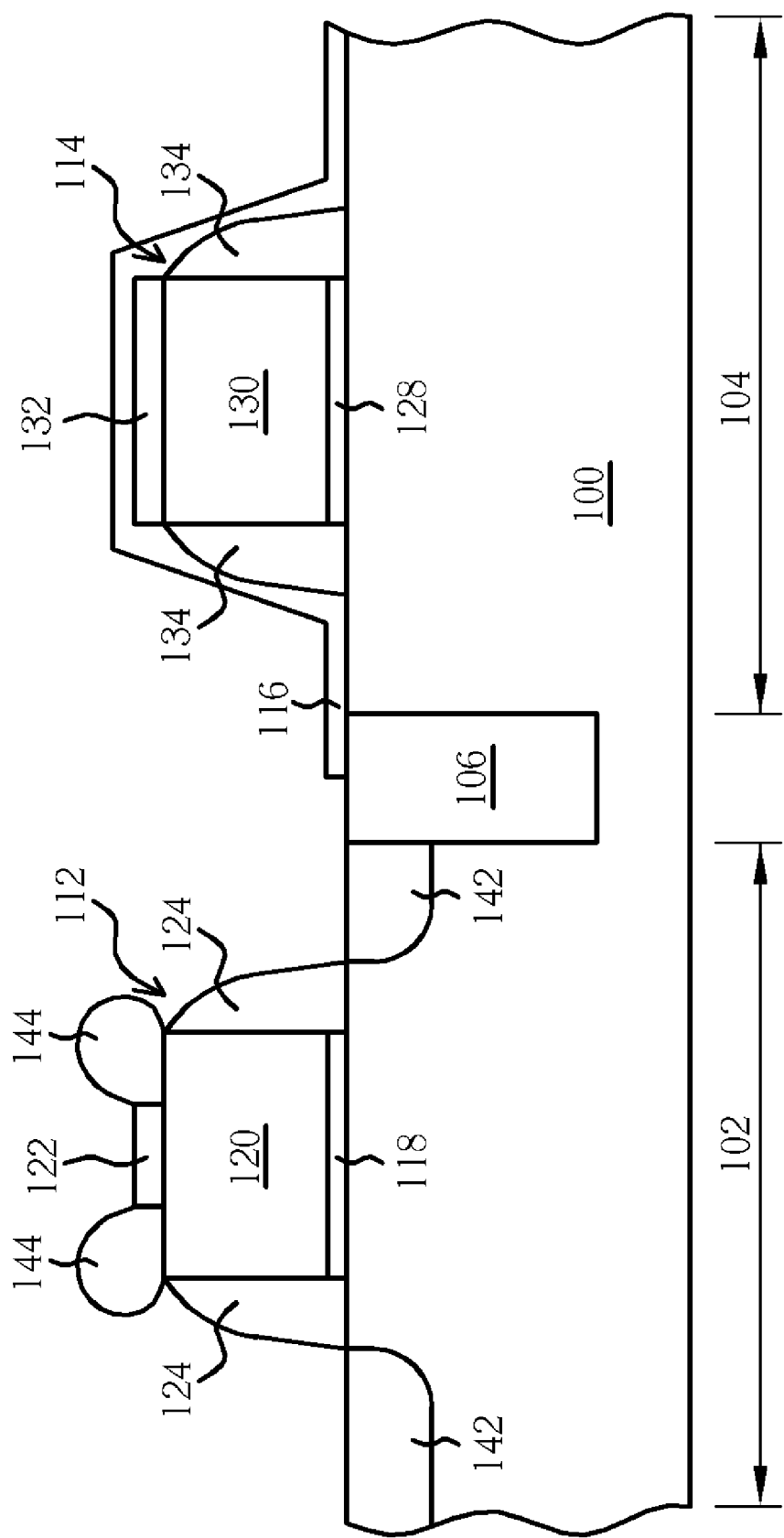
Figure 4:
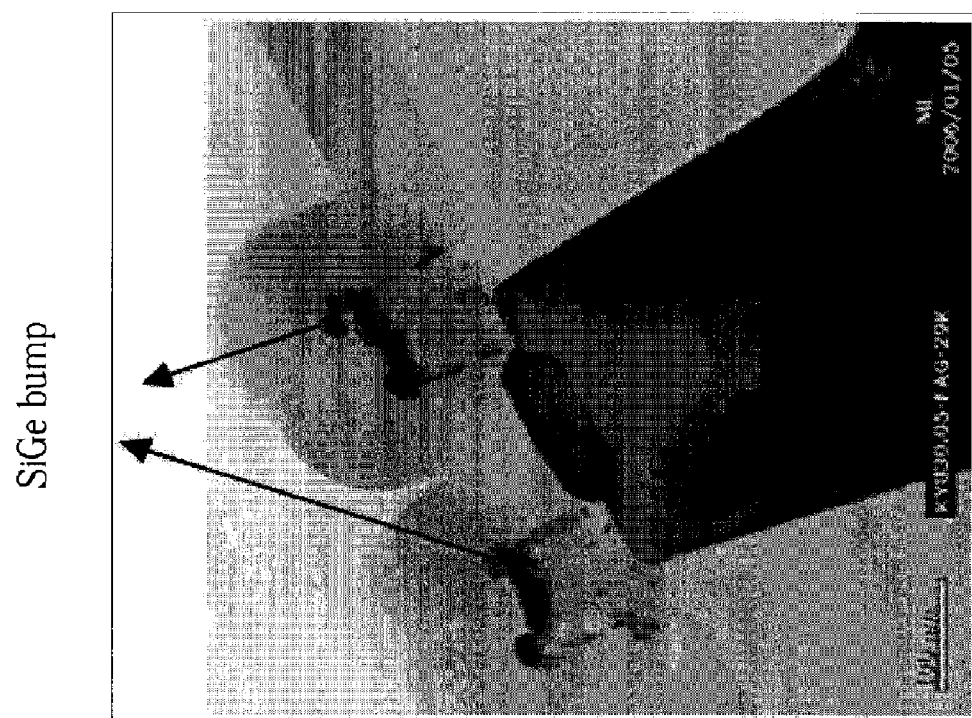

Then, as shown in FIG. 1, after a pre-cleaning step such as using DHF liquid or SPM liquid to remove impurities upon the surface of the recesses 250 is carried out for the second active area 204 of the semiconductor substrate 200, a SEG process is carried out to form a second epitaxial layer 252 composed of SiC in the recesses 250 respectively to form a tensile-stressed strained silicon channel in the semiconductor substrate 200 of the second gate structure 214.

Figure 12:
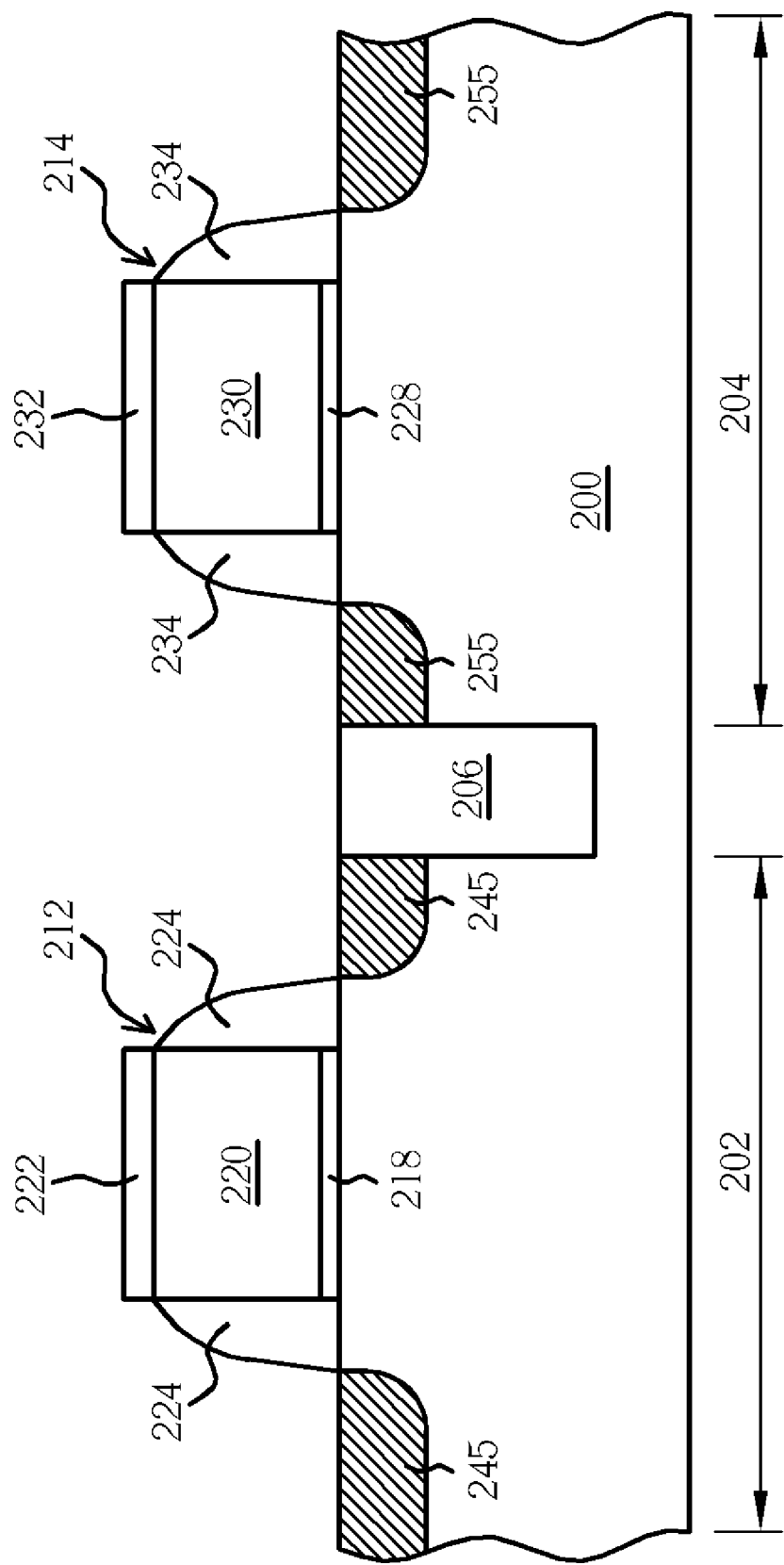

At last, a photoresist layer (not shown) is formed on the first active area 202, and then an ion implantation process is carried out for the second epitaxial layer 252 by using the photoresist layer and the second gate structure 214 as an ion implantation mask to implant N type dopants such as arsenic, antimony or phosphorous into the second epitaxial layer 252 and form source/drain regions 255 of the NMOS in the strained silicon channel CMOS, as shown in FIG. 12, and then the photoresist layer on the second active area 204 is removed.

Figure 13:
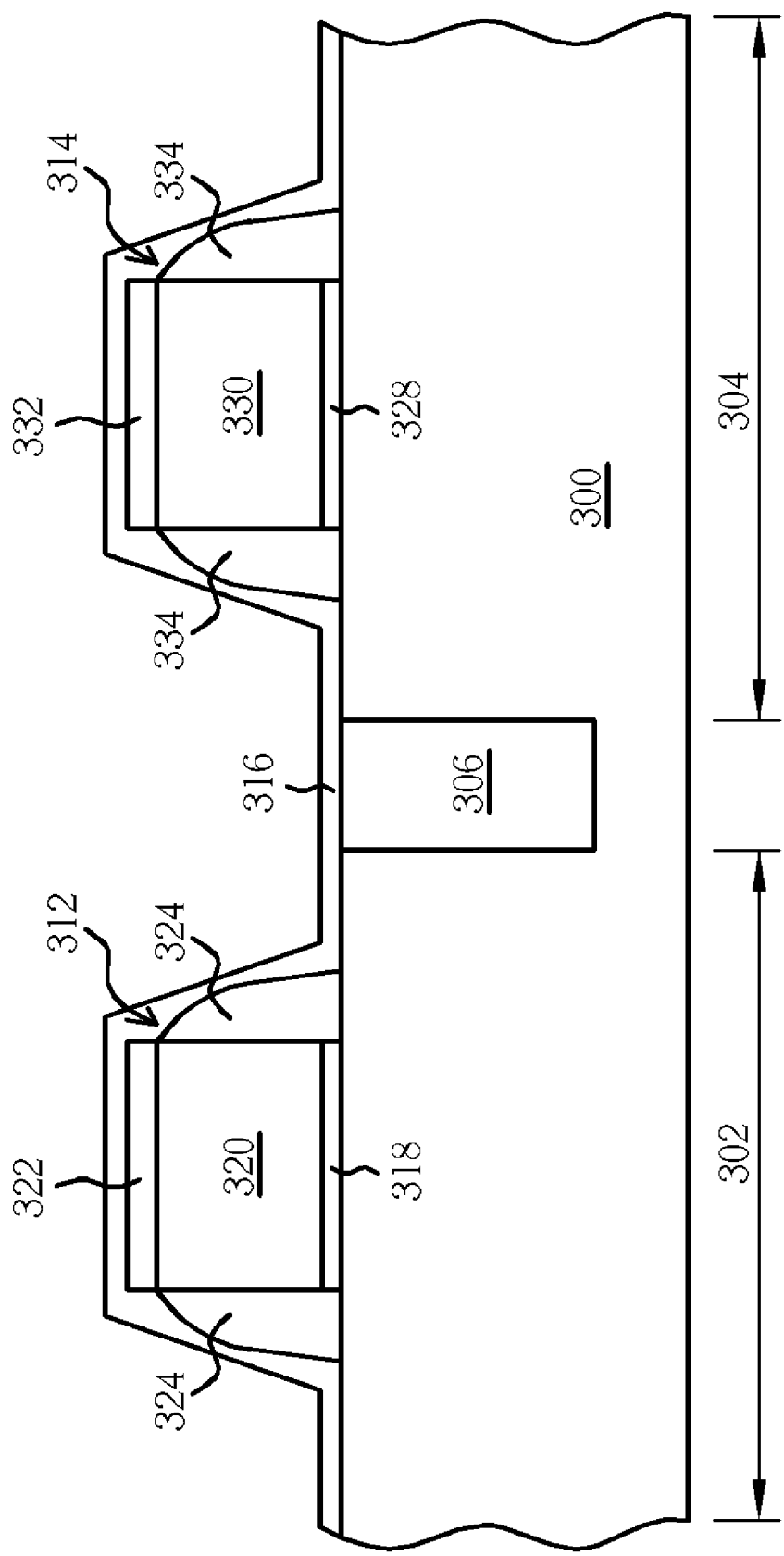

Please refer to FIG. 13 to FIG. 17. FIG. 13 to FIG. 17 shows schematic, cross-sectional diagrams illustrating a fabricating method of a strained silicon channel CMOS transistor in accordance with the second preferred embodiment of the present invention. As shown in FIG. 13, the present invention first provides a substrate 300, and same as the first preferred embodiment, the substrate 300 has a first active area 302, a second active area 304, and an isolation structure 306 positioned between the first active area 302 and the second active area 304. Next, a first gate structure 312 and a second gate structure 314 are formed on the semiconductor substrate 300, and then a cap layer 316 is formed on the first gate structure 312, the second gate structure 314, and the semiconductor substrate 300, wherein the cap layer 316 can be SiO2, and the thickness of the cap layer 316 can be about 50 to 200 angstroms. The first gate structure 312 includes a first gate dielectric layer 318, a first gate conducting layer 320 positioned on the first gate dielectric layer 318, a first passivation layer 322 positioned on the first gate conducting layer 320, and a first spacer 324, and the second gate structure 314 includes a second gate dielectric layer 328, a second gate conducting layer 330 positioned on the second gate dielectric layer 328, a second passivation layer 332 positioned on the second gate conducting layer 330, and a second spacer 334. In general, the first gate dielectric layer 318 and the second gate dielectric layer 328 are composed of SiO2, and the first gate conducting layer 320 and the second gate conducting layer 330 are composed of doped polysilicon. The first passivation layer 322 and second passivation layer 332 are used to protect the first gate conducting layer 320 and the second gate conducting layer 330 respectively.

Figure 14:
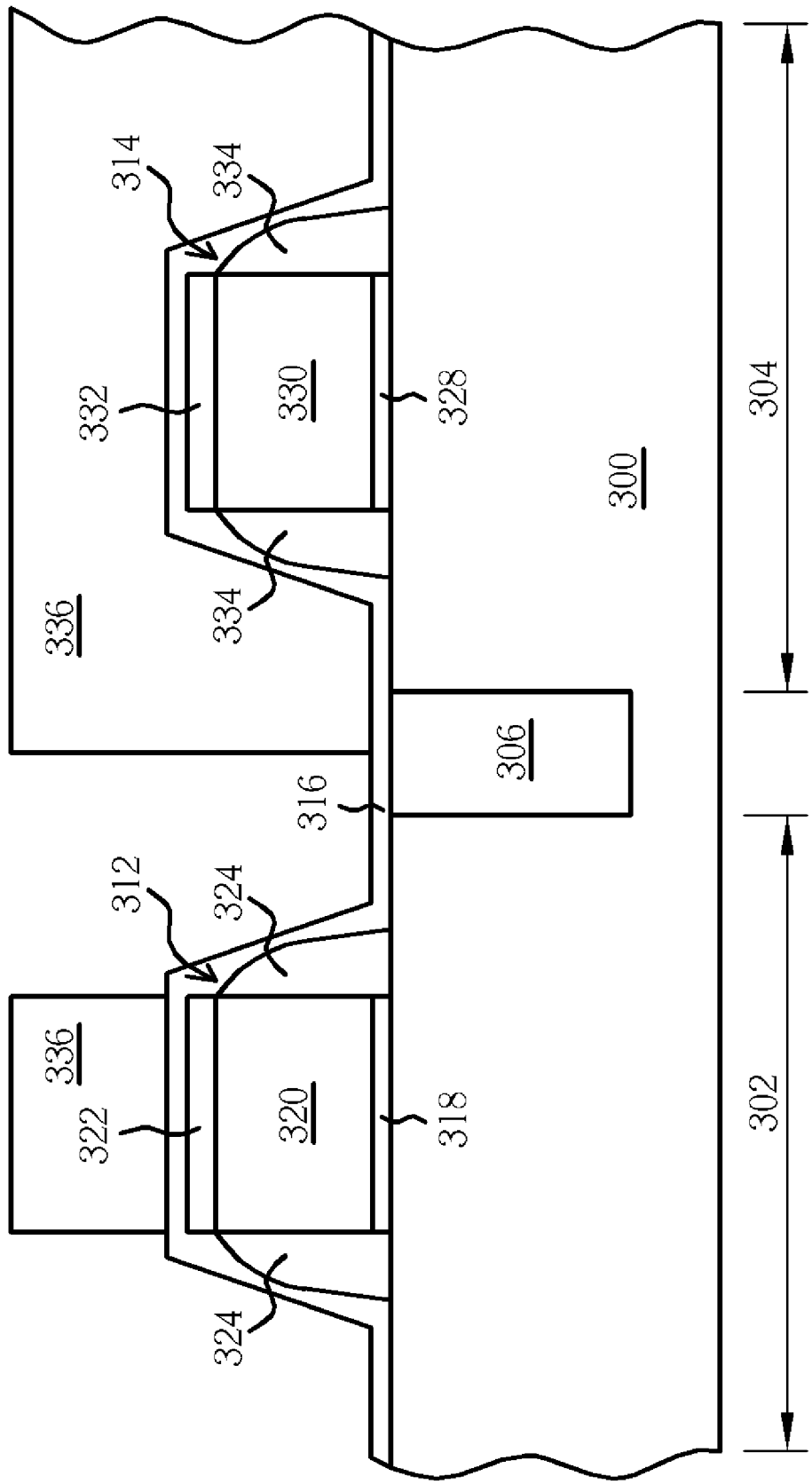

Next, as shown in FIG. 14, a patterned first mask layer 336 is formed on the cap layer 316 above the first gate structure 312, the second active area 304, and a portion of the isolation structure 306, wherein the first mask layer 336 can be materials with etching selectivity to the substrate 300, such as a photoresist layer. In addition, since the exposure misalign might happen when the first mask layer 336 is formed, and the first gate conducting layer 320 might have the critical dimension variation, in order to be sure that the first mask layer 336 on the first gate structure 312 can fully protect the first gate structure 312, the width of the first mask layer 336 on the first gate structure 312 has to be not smaller than the sum of the critical dimension of the first gate conducting layer 320, the critical dimension variation of the first gate conducting layer 320, and the exposure misalign of the first mask layer 336, and the width of the first mask layer 336 has to be not larger than the sum of the critical dimension of the first gate conducting layer 320 and the width of the first spacer 324 to avoid affecting the position of the recesses that will be formed later.

Figure 15:
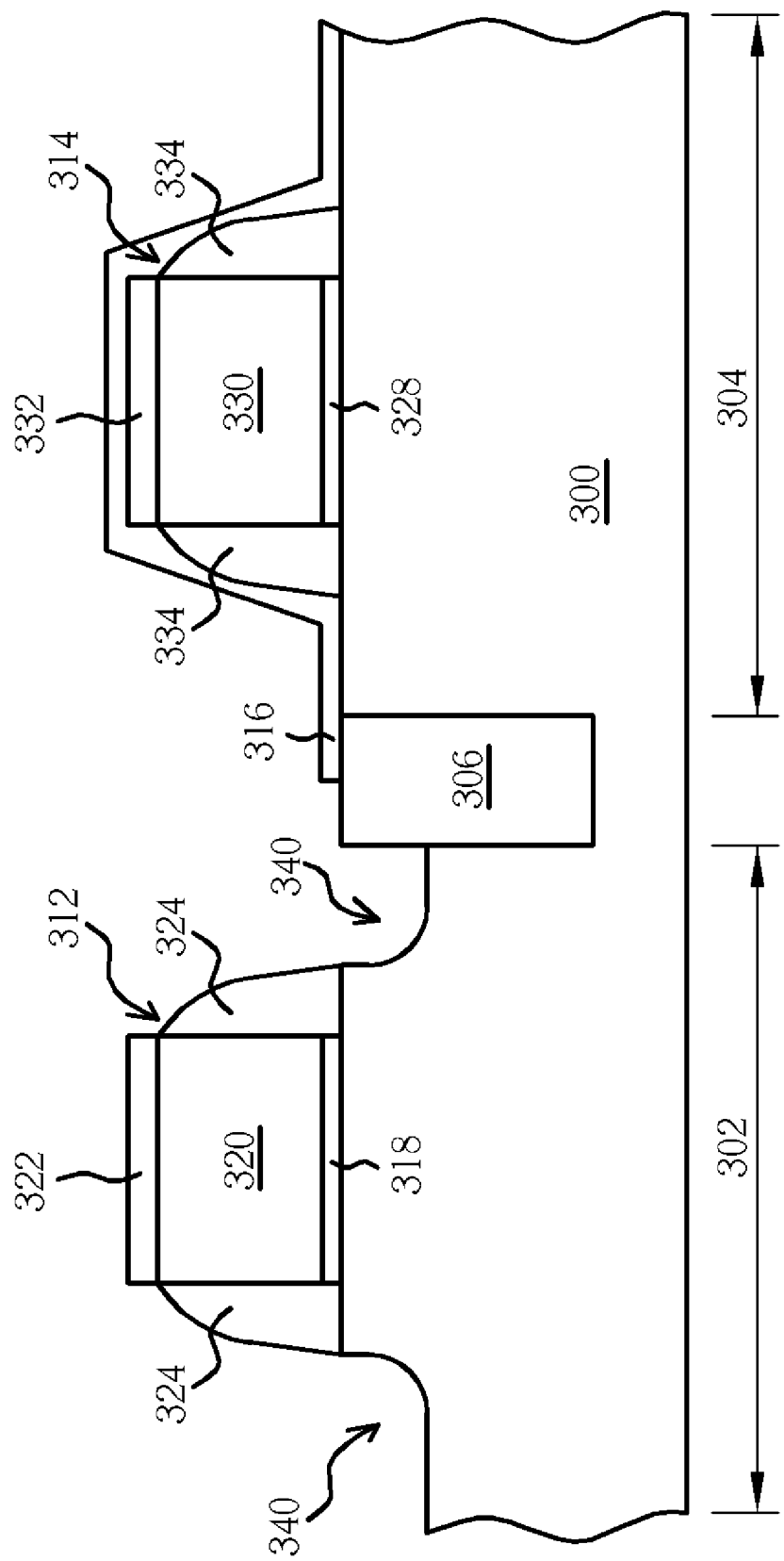

Next, as shown in FIG. 15, the first gate structure 312 and the first mask layer 336 are used as an etching mask to perform an etching process such as an anisotropic dry etching process, in order to form two recesses 340 within the first active area 302 uncovered by the first gate structure 312 and the first mask layer 336, and then and the first mask layer 336 is removed.

Figure 16:
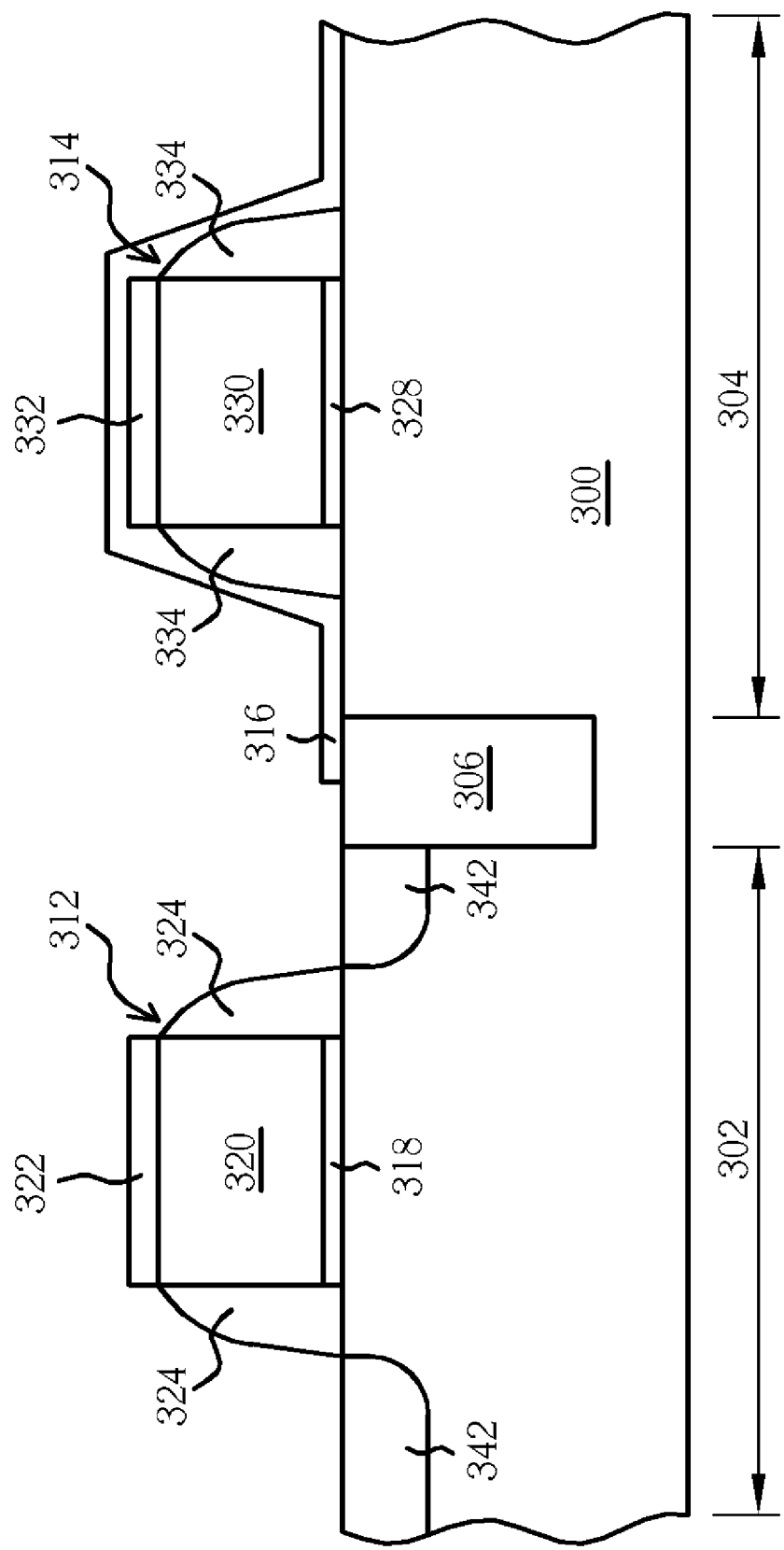

Then, as shown in FIG. 16, after a pre-cleaning step such as using DHF liquid or SPM liquid to remove impurities upon the surface of the recesses 340 is carried out for the first active area 302 of the semiconductor substrate 300, a SEG process is carried out to form a first epitaxial layer 342 composed of SiGe in the recesses 340 respectively to form a compressive-stressed strained silicon channel in the semiconductor substrate 300 of the first gate structure 312.

Figure 17:
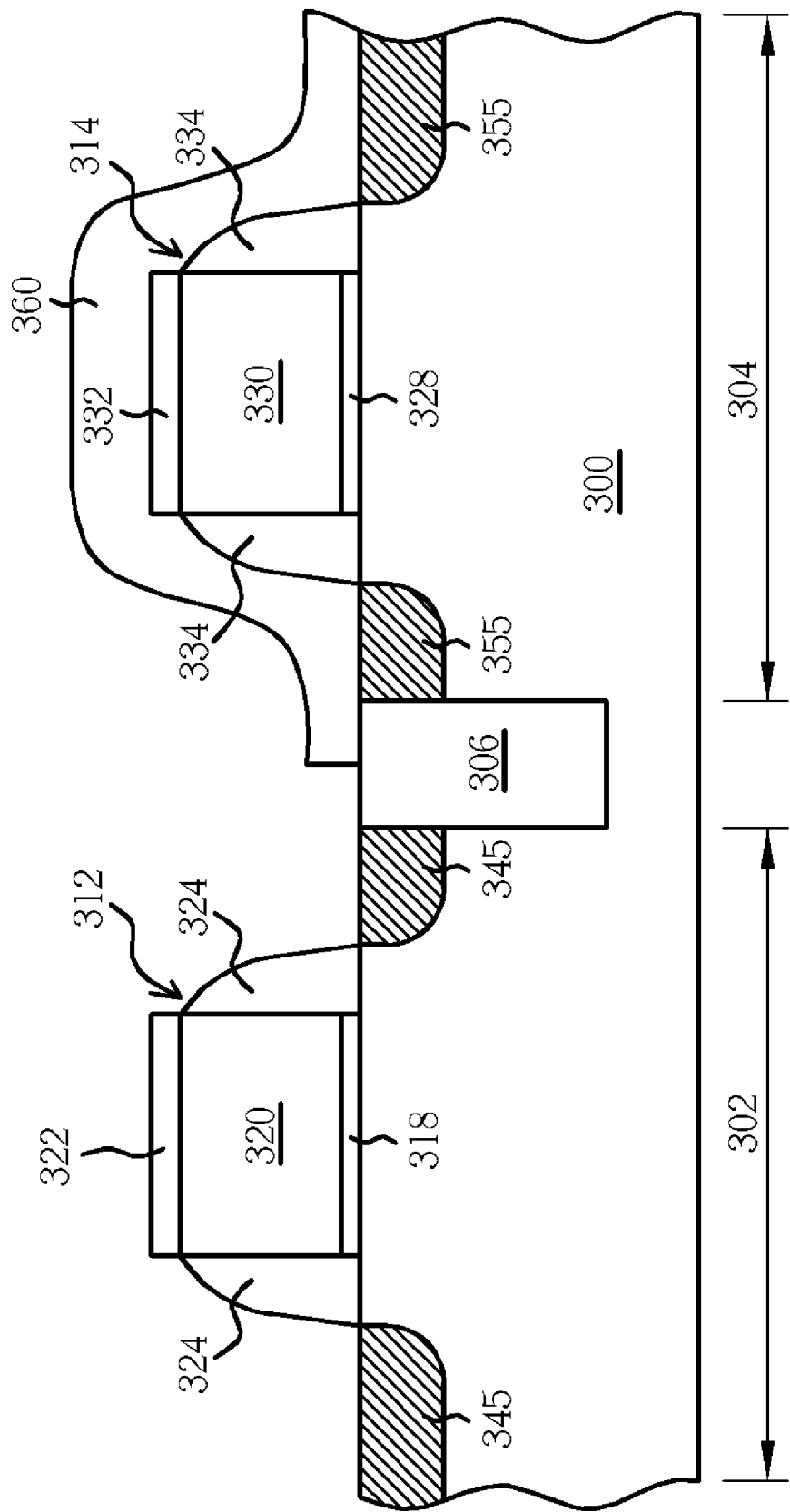

As shown in FIG. 17, and then the photoresist layer on the second active area 304 is removed. Next, a photoresist layer (not shown) is formed on the first active area 302 and then an ion implantation process is carried out for the second active area 304 in two sides of the second gate structure 314 by using the photoresist layer and the second gate structure 314 as an ion implantation mask to implant N type dopants such as arsenic, antimony or phosphorous into the semiconductor substrate 300 of the second active area 304 and form source/drain regions 355 of the NMOS in the strained silicon channel CMOS, and then the photoresist layer on the first active area 302 is removed. At last, a stressed layer 360 is formed on the second active area 304, and the stressed layer 360 is a tensile-stressed contact etch stop layer (CESL) to form a tensile-stressed strained silicon channel between the source/drain regions 355 of the NMOS.

Figure 18:
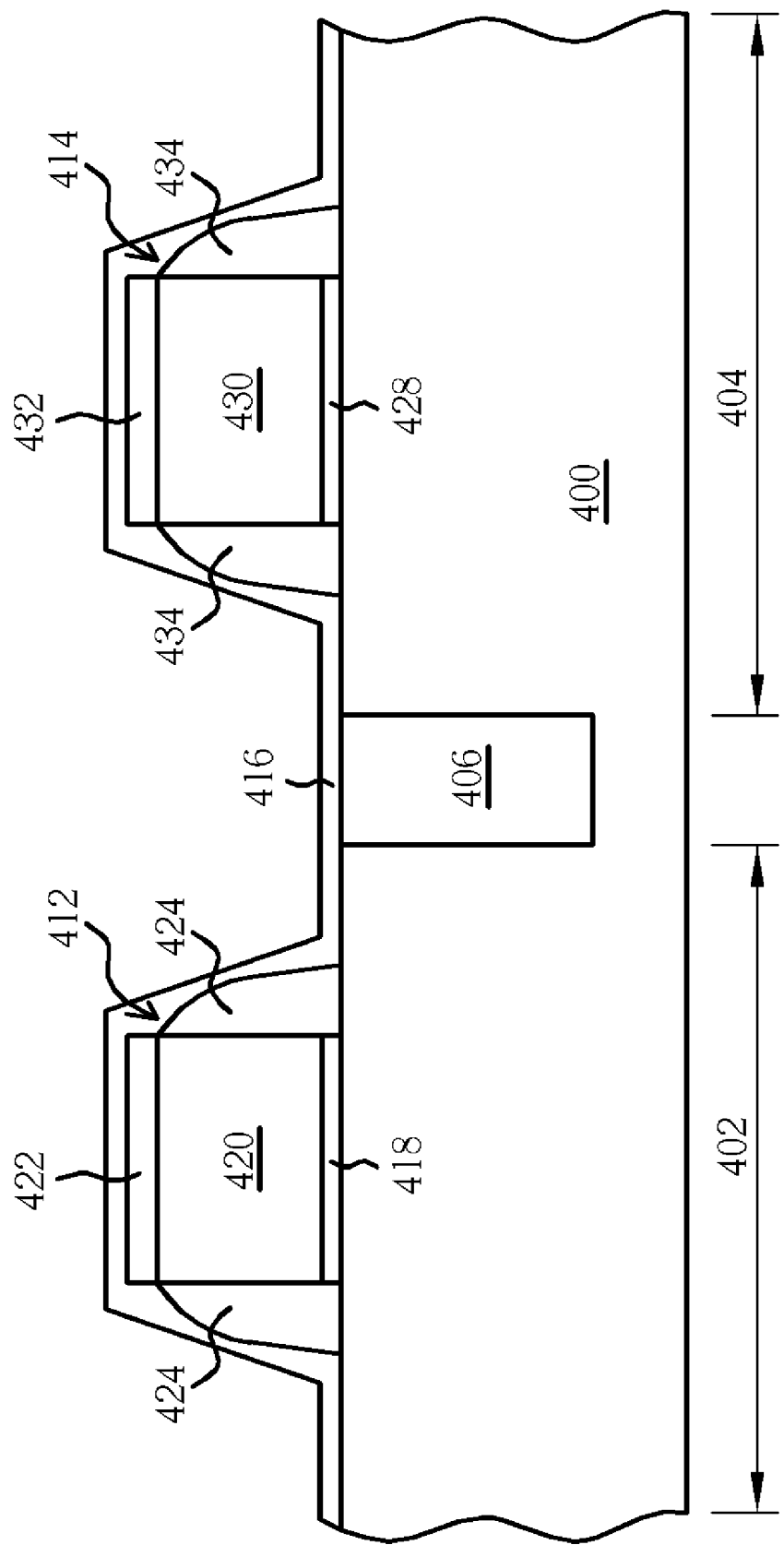
FIG. 18 to FIG. 22 shows schematic, cross-sectional diagrams illustrating a fabricating method of a strained silicon channel CMOS transistor in accordance with the third preferred embodiment of the present invention.

Please refer to FIG. 18 to FIG. 22. FIG. 18 to FIG. 22 shows schematic, cross-sectional diagrams illustrating a fabricating method of a strained silicon channel CMOS transistor in accordance with the third preferred embodiment of the present invention. As shown in FIG. 18, the present invention first provides a substrate 400, and same as the first and second preferred embodiments, the substrate 400 has a first active area 402, a second active area 404, and an isolation structure 406 positioned between the first active area 402 and the second active area 404. Next, a first gate structure 412 and a second gate structure 414 are formed on the semiconductor substrate 400, and then a cap layer 416 is formed on the first gate structure 412, the second gate structure 414, and the semiconductor substrate 400, wherein the cap layer 416 can be SiO2, and the thickness of the cap layer 416 can be about 50 to 200 angstroms. The first gate structure 412 includes a first gate dielectric layer 418, a first gate conducting layer 420 positioned on the first gate dielectric layer 418, a first passivation layer 422 positioned on the first gate conducting layer 420, and a first spacer 424, and the second gate structure 414 includes a second gate dielectric layer 428, a second gate conducting layer 430 positioned on the second gate dielectric layer 428, a second passivation layer 432 positioned on the second gate conducting layer 430, and a second spacer 434. In general, the first gate dielectric layer 418 and the second gate dielectric layer 428 are composed of SiO2, and the first gate conducting layer 420 and the second gate conducting layer 430 are composed of doped polysilicon. The first passivation layer 422 and second passivation layer 432 are used to protect the first gate conducting layer 420 and the second gate conducting layer 430 respectively.

Figure 19:
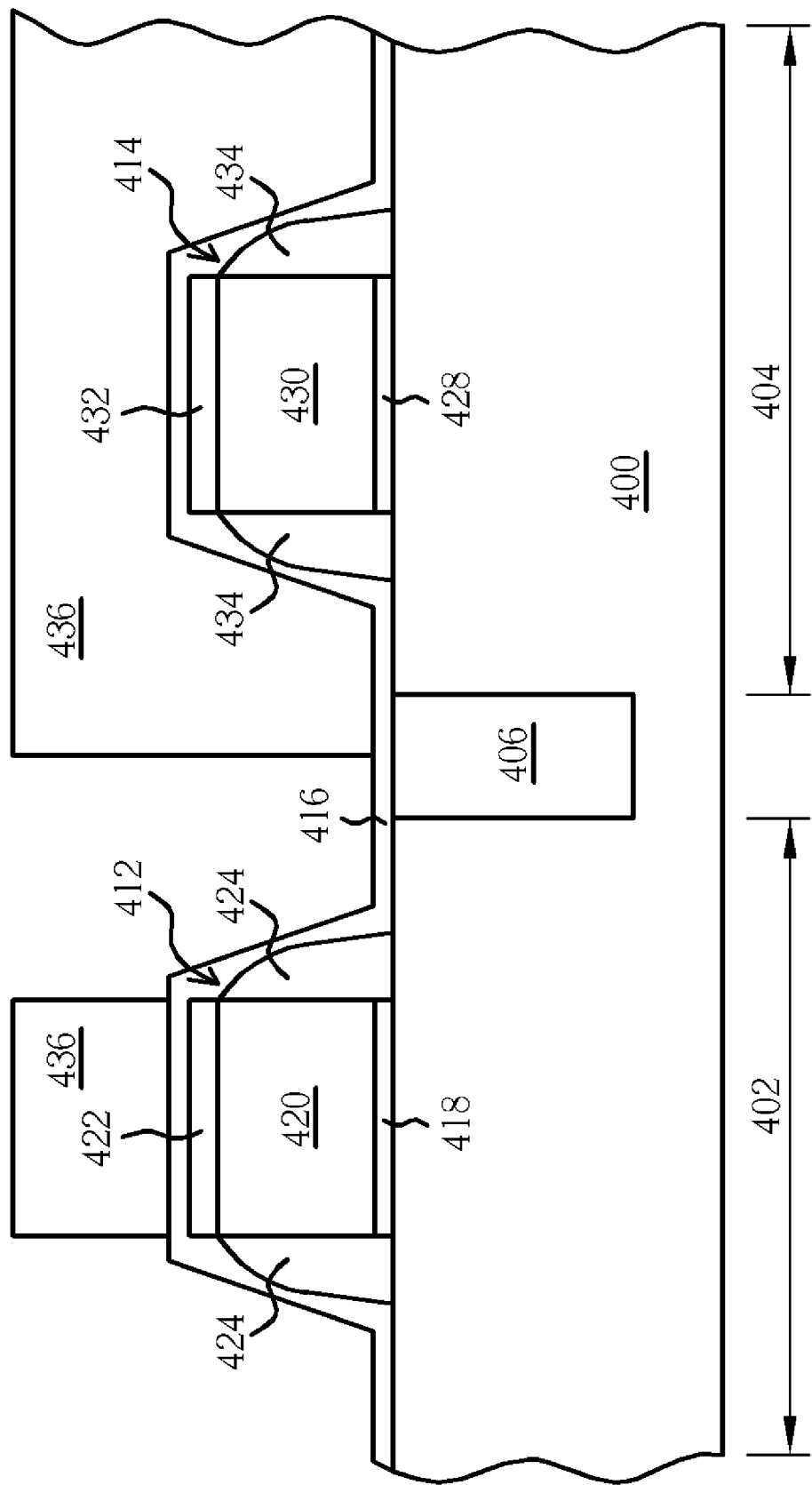

Next, as shown in FIG. 19, a patterned first mask layer 436 is formed on the cap layer 416 above the first gate structure 412, the second active area 404, and a portion of the isolation structure 406, wherein the first mask layer 436 can be materials with etching selectivity to the substrate 400, such as a photoresist layer or a silicon oxide layer. In addition, since the exposure misalign might happen when the first mask layer 436 is formed, and the first gate conducting layer 420 might have the critical dimension variation, in order to be sure that the first mask layer 436 on the first gate structure 412 can fully protect the first gate structure 412, the width of the first mask layer 436 on the first gate structure 412 has to be not smaller than the sum of the critical dimension of the first gate conducting layer 420, the critical dimension variation of the first gate conducting layer 420, and the exposure misalign of the first mask layer 436, and the width of the first mask layer 436 has to be not larger than the sum of the critical dimension of the first gate conducting layer 420 and the width of the first spacer 424 to avoid affecting the position of the recesses that will be formed later.

Figure 20:
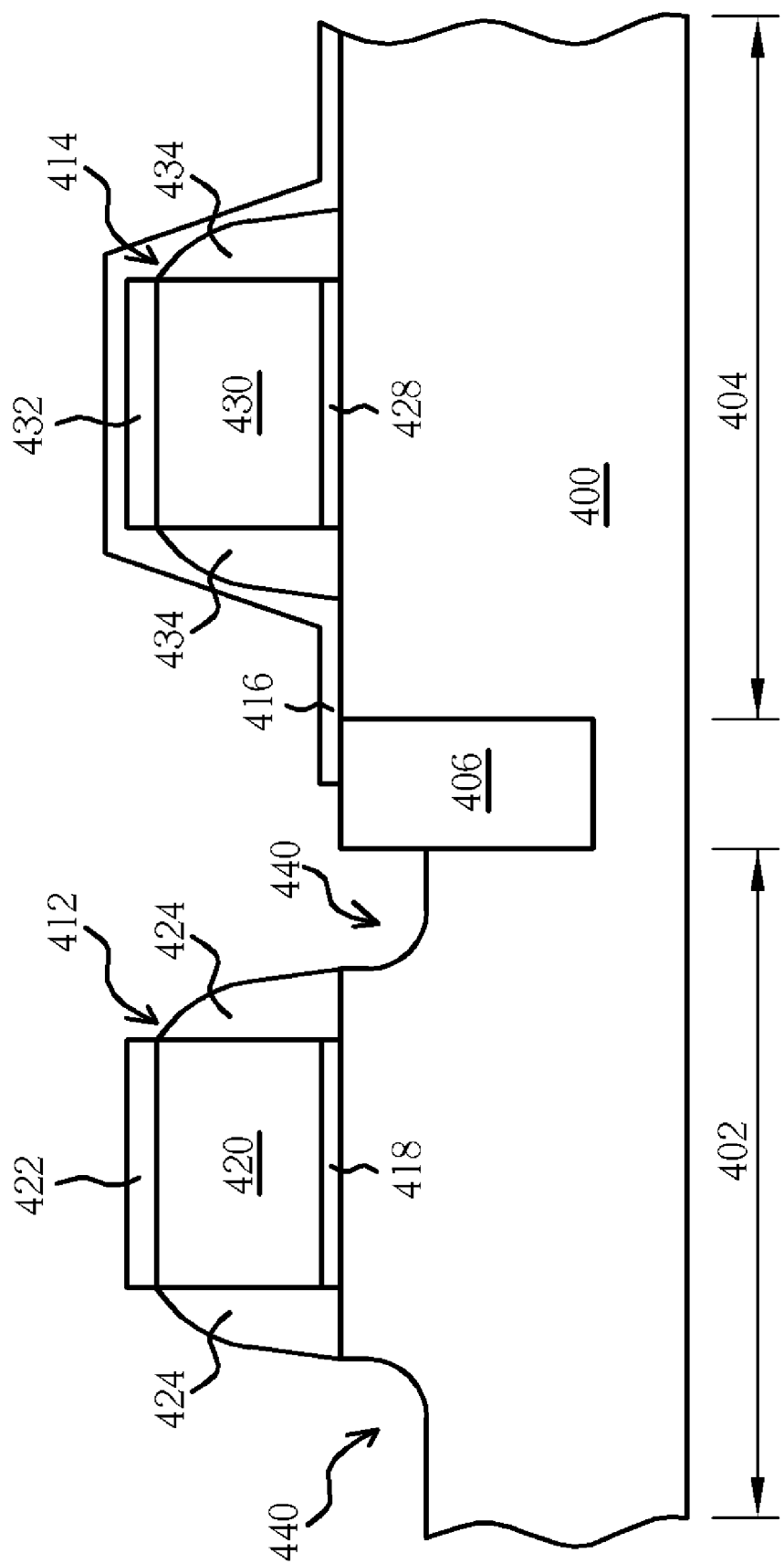

Next, as shown in FIG. 20, the first gate structure 412 and the first mask layer 436 are used as an etching mask to perform an etching process such as an anisotropic dry etching process, in order to form two recesses 440 within the first active area 402 uncovered by the first gate structure 412 and the first mask layer 436, and then and the first mask layer 436 is removed.

Figure 21:
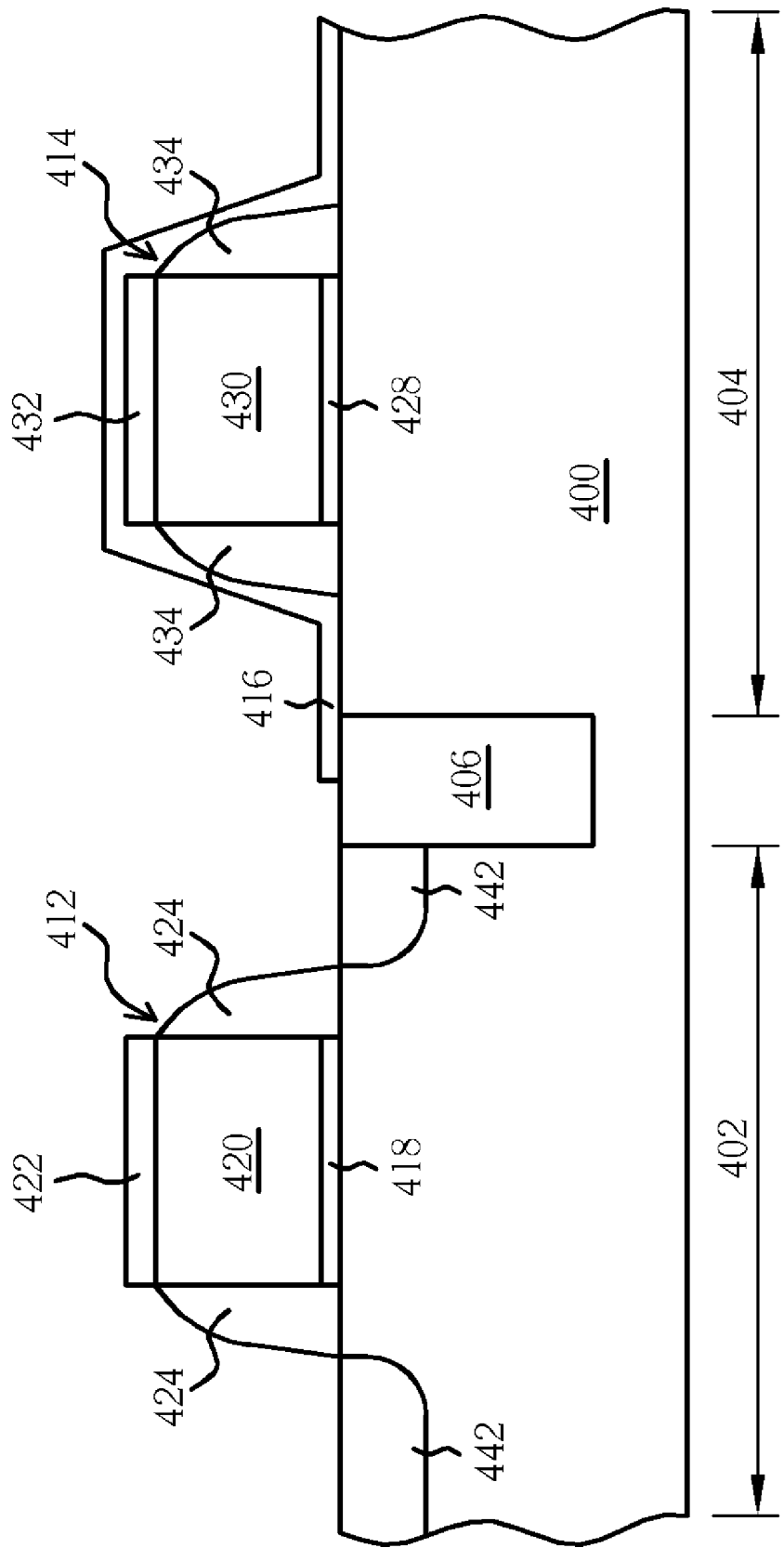

Then, as shown in FIG. 21, after a pre-cleaning step such as using DHF liquid or SPM liquid to remove impurities upon the surface of the recesses 440 is carried out for the first active area 402 of the semiconductor substrate 400, a SEG process is carried out to form a first epitaxial layer 442 composed of SiC in the recesses 440 respectively to form a tensile-stressed strained silicon channel in the semiconductor substrate 400 of the first gate structure 412.

Figure 22:
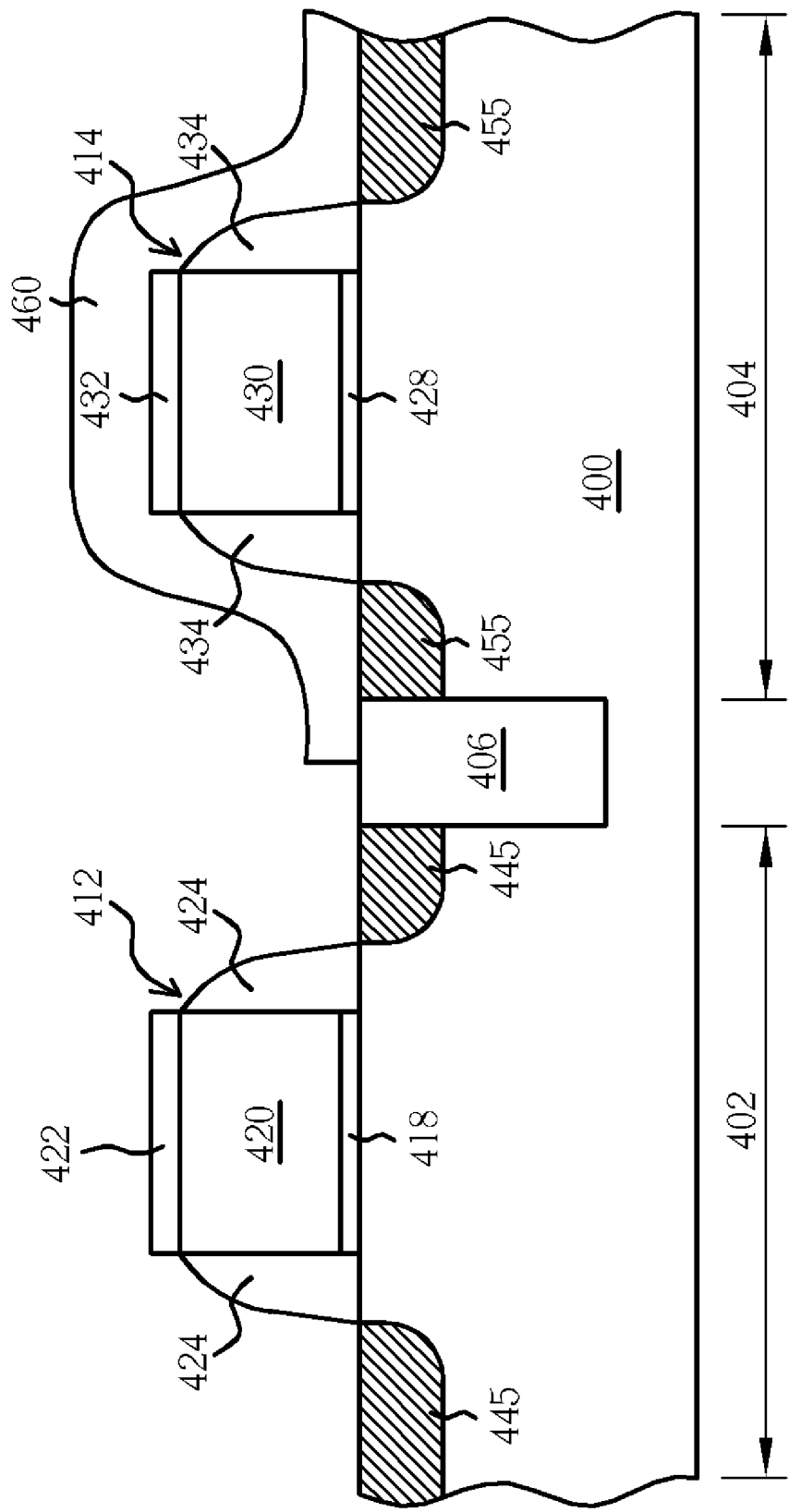

Next, a photoresist layer (not shown) is formed on the second active area 404, and then an ion implantation process is carried out for the first epitaxial layer 442 by using the photoresist layer and the first gate structure 412 as an ion implantation mask to implant N type dopants such as arsenic, antimony or phosphorous into the first epitaxial layer 442 and form source/drain regions 445 of the NMOS in the strained silicon channel CMOS, as shown in FIG. 22, and then the photoresist layer on the second active area 404 is removed. Next, a photoresist layer (not shown) is formed on the first active area 402 and then an ion implantation process is carried out for the second active area 404 in two sides of the second gate structure 414 by using the photoresist layer and the second gate structure 414 as an ion implantation mask to implant P type dopants such as boron into the semiconductor substrate 400 of the second active area 304 and form source/drain regions 455 of the PMOS in the strained silicon channel CMOS, and then the photoresist layer on the first active area 402 is removed. At last, a stressed layer 460 is formed on the second active area 404, and the stressed layer 460 is a compressive-stressed contact etch stop layer (CESL) for forming a compressive-stressed strained silicon channel between the source/drain regions 455 of the PMOS.

This defect will result in spacer leakage current or short problems, and the follow-up processes will be much more difficult. For example, when fabricating the contact plugs of the source/drain regions, the SiGe bumps might contact the contact plugs and become short, i.e. the contact plug process is affected by the SiGe bumps, and the yield is also affected badly.

Since the present invention provides a method of fabricating a strained silicon channel CMOS transistor by using a mask layer to avoid the defects resulting from etching the recesses and the SEG process in the prior art, the SiGe bumps and the spacer leakage current or short problems will not happen and the follow-up processes will not be affected, either. In the mean time, the thickness of the cap layer can be reduced to be about 50 to 200 angstroms. In addition, the method of the present invention is also able to be applied for fabricating the ordinary MOS transistors, and is not limited to the CMOS transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a strained silicon channel metal oxide semiconductor (MOS) transistor, the method comprising:
   providing a substrate;
   forming at least a gate structure on the substrate;
   forming a mask layer on the gate structure;
   performing an etching process to form two recesses corresponding to the gate structure within the substrate;
   performing a selective epitaxial growth (SEG) process to form an epitaxial layer in the recesses respectively; and
   performing an ion implantation process for the epitaxial layers to form a source/drain region.

2. The method of claim 1 wherein the gate structure further comprises:
   a gate dielectric layer;
   a gate conducting layer, positioned on the gate dielectric layer, the gate conducting layer having a sidewall; and
   a spacer, positioned on the sidewall of the gate conducting layer.

3. The method of claim 2 wherein a width of the mask layer is not smaller than the sum of the critical dimension of the gate conducting layer, the critical dimension variation of the gate conducting layer, and the exposure misalign of the mask layer.

4. The method of claim 3 wherein the width of the mask layer is not larger than the sum of the critical dimension of the gate conducting layer and a width of the spacer.

5. The method of claim 1 wherein the MOS transistor comprises a PMOS transistor.

6. The method of claim 5 wherein the epitaxial layer comprises SiGe.

7. The method of claim 1 wherein the MOS transistor comprises a NMOS transistor.

8. The method of claim 7 wherein the epitaxial layer comprises SiC.

9. The method of claim 1 wherein the mask layer comprises a photoresist layer.

10. The method of claim 1 further comprising a cap layer covering the substrate and the gate structure.

11. A method of fabricating strained silicon channel complementary metal oxide semiconductor (CMOS) transistor device, the method comprising:
    providing a substrate having thereon a first active area for fabricating a first transistor and a second active area for fabricating a second transistor, and an isolation structure between the first active area and the second active area;
    forming a first gate structure on the first active area, and a second gate structure on the second active area;
    forming a mask layer on the first gate structure and the second active area;
    performing an etching process to form two recesses corresponding to the first gate structure within the substrate;
    performing a selective epitaxial growth process to form a first epitaxial layer in the recesses respectively;
    performing an ion implantation process for the first epitaxial layers to form a source/drain region of the first transistor; and
    forming a source/drain region of the second transistor to form the second transistor.

12. The method of claim 11 wherein the first gate structure further comprises:
    a first gate dielectric layer;
    a first gate conducting layer, positioned on the first gate dielectric layer, the first gate conducting layer having a sidewall; and
    a first spacer, positioned on the sidewall of the first gate conducting layer.

13. The method of claim 12 wherein a width of the first mask layer on the first gate structure is not smaller than the sum of the critical dimension of the first gate conducting layer, the critical dimension variation of the first gate conducting layer, and the exposure misalign of the first mask layer.

14. The method of claim 13 wherein the width of the first mask layer is not larger than the sum of the critical dimension of the first gate conducting layer and a width of the first spacer.

15. The method of claim 11 wherein the second gate structure further comprises:
    a second gate dielectric layer;

a second gate conducting layer, positioned on the second gate dielectric layer, the second gate conducting layer having a sidewall; and a second spacer, positioned on the sidewall of the second gate conducting layer.

16. The method of claim 11 wherein the first mask layer comprises a photoresist layer or a silicon oxide layer.

17. The method of claim 11 further comprising a cap layer covering the substrate, the first gate structure, and the second gate structure.

18. The method of claim 11 wherein the method of forming the second transistor further comprises:

forming a second mask layer on the first active area and the second gate structure;

performing an etching process to form two recesses corresponding to the second gate structure within the substrate;

performing a selective epitaxial growth process to form a second epitaxial layer in the recesses respectively; and performing an ion implantation process for the second epitaxial layers to form a source/drain region of the second transistor.

19. The method of claim 18 wherein a width of the second mask layer on the second gate structure is not smaller than the sum of the critical dimension of the second gate conducting layer, the critical dimension variation of the second gate conducting layer, and the exposure misalign of the second mask layer.

20. The method of claim 19 wherein the width of the second mask layer is not larger than the sum of the critical dimension of the second gate conducting layer and a width of the second spacer.

21. The method of claim 18 wherein the first transistor comprises a PMOS transistor, and the second transistor comprises a NMOS transistor.

22. The method of claim 21 wherein the first epitaxial layer comprises SiGe, and the second epitaxial layer comprises SiC.

23. The method of claim 18 wherein the first transistor comprises a NMOS transistor, and the second transistor comprises a PMOS transistor.

24. The method of claim 23 wherein the first epitaxial layer comprises SiC, and the second epitaxial layer comprises SiGe.

25. The method of claim 11 wherein the source/drain region of the second transistor is formed by using an ion implantation process.

26. The method of claim 25 wherein the first transistor comprises a PMOS transistor, and the second transistor comprises a NMOS transistor.

27. The method of claim 26 wherein the first epitaxial layer comprises SiGe.

28. The method of claim 25 wherein the first transistor comprises a NMOS transistor, and the second transistor comprises a PMOS transistor.

29. The method of claim 28 wherein the first epitaxial layer comprises SiC.

30. The method of claim 28 wherein the first epitaxial layer comprises SiC, and the stressed layer is a compressive-stressed CESL.

31. The method of claim 25 further comprising a step of forming a stressed layer on the second active area.

32. The method of claim 31 wherein the first transistor comprises a PMOS transistor, and the second transistor comprises a NMOS transistor.

33. The method of claim 32 wherein the first epitaxial layer comprises SiGe, and the stressed layer is a tensile-stressed contact etch stop layer (CESL).

34. The method of claim 33 wherein the first transistor comprises a NMOS transistor, and the second transistor comprises a PMOS transistor.

* * * * *